(12) United States Patent
Kwon et al.

(10) Patent No.: US 7,400,222 B2
(45) Date of Patent: Jul. 15, 2008

(54) GROOVED COAXIAL-TYPE TRANSMISSION LINE, MANUFACTURING METHOD AND PACKAGING METHOD THEREOF

(75) Inventors: Young Se Kwon, Daejeon (KR); Ju Hyun Ko, Daejeon (KR); Seong Ho Shin, Daegu (KR)

(73) Assignee: Korea Advanced Institute of Science & Technology, Daejeon (KR)

( * ) Notice: Subject to any disclaimer, the term of this patent is extended or adjusted under 35 U.S.C. 154(b) by 0 days.

(21) Appl. No.: 10/864,077

(22) Filed: Jun. 8, 2004

(65) Prior Publication Data

US 2005/0057327 A1 Mar. 17, 2005

(30) Foreign Application Priority Data

Sep. 15, 2003 (KR) .................. 10-2003-0063746

(51) Int. Cl.
*H01P 3/06* (2006.01)
(52) U.S. Cl. ....................... 333/243; 333/247
(58) Field of Classification Search .......... 333/238, 333/243, 247
See application file for complete search history.

(56) References Cited

U.S. PATENT DOCUMENTS 5,949,312 A * 9/1999 Buer et al. ............... 333/246
5,990,768 A * 11/1999 Takahashi et al. ........... 333/247
6,225,878 B1 * 5/2001 Takahashi et al. ........... 333/204

OTHER PUBLICATIONS

2003 IEEE MTT-S International Microwave Symposium Digest, vol. 3, dated Jun. 8-13, 2003, in Philadelphia, PA IEEE Catalog No. 03CH37411.

* cited by examiner

*Primary Examiner*—Benny Lee
(74) *Attorney, Agent, or Firm*—Graybeal Jackson Haley LLP

(57) ABSTRACT

Disclosed herein are a transmission line of coaxial type and a manufacturing method thereof, capable of preventing a radiative signal loss of signal lines during transmission of an RF signal and removing signal interference between adjacent signal lines, thus allowing signal lines to be compactly arrayed during a manufacture of IC, and reducing a dimension of the IC. The transmission line of coaxial type includes grooves provided on a semiconductor substrate, a first ground layer, an electrically conductive epoxy coated on a flat part of the first ground layer except the grooves, second ground layers provided on the electrically conductive epoxy, a dielectric film provided at a position above the grooves and the second ground layers, a third ground layer provided on an upper surface of the dielectric film, and signal lines placed in spaces defined by the grooves and a lower surface of the dielectric film. In this case, the electrically conductive epoxy is coated on only contact surfaces of the first and second ground layers, and the signal lines are attached to the lower surface of the dielectric film.

11 Claims, 6 Drawing Sheets

GROOVED COAXIAL-TYPE TRANSMISSION LINE, MANUFACTURING METHOD AND PACKAGING METHOD THEREOF

PRIORITY CLAIM

This continuation-in-part application claims priority from Korean Patent Application No. 2003-63746 filed 15 Sep. 2003, which is incorporated herein by reference.

BACKGROUND OF THE INVENTION

1. Field of the Invention

The present invention relates generally to transmission lines and more particularly, to a coaxial transmission line which reduces a signal loss during transmission of a radio frequency (RF) signal, and reduces signal interference between adjacent signal lines, and is manufactured by improved packaging technologies. Further, the present invention relates to a method of manufacturing the coaxial transmission line, and a method of packaging the coaxial transmission line.

2. Description of the Related Art

Typically, a coplanar-type transmission line system and a microstrip-type transmission line system have been widely used to transmit RF signals.

The coplanar-type transmission line system is constructed so that a signal line and ground wires are arranged on the same plane. In this case, the ground wires are placed on opposite sides of the signal line. Because it is possible to arrange the signal line and the ground wires on the same plane as described above, the coplanar-type transmission line system has been widely used to make a circuit using a semiconductor substrate or a ceramic substrate.

Further, the microstrip-type transmission line system includes a signal line on an upper surface of a substrate, and a ground wire on a lower surface of the substrate. However, the microstrip-type transmission line system has a problem in that a via hole must be formed to connect the signal line provided on the upper surface of the substrate to the ground wire provided on the lower surface of the substrate. Thus, the microstrip-type transmission line system has been limitedly used for a substrate made of a soft material which allows the via hole to be easily formed, such as a printed circuit board (PCB). However, due to development of a semiconductor manufacturing technology, the microstrip-type transmission line system is also employed to the semiconductor substrate and the ceramic substrate.

Since the signal lines in the above-mentioned transmission line systems are not shielded, that is, are open, radiative signal losses of the signal lines occur during the transmission of signals, and further, signal interference occurs due to the radiative signals. In order to overcome the above problems, there is proposed a method of building a shielding wall made of a metal material to shield each signal line. However, it is difficult to execute such a method of building the shielding walls, thus undesirably causing an increase in the manufacturing costs.

Recently, as a frequency in RF electrical equipment and an output power of the equipment becomes higher, the signal interference is further increased. Thus, those skilled in the art have made efforts to develop a coaxial transmission line which is capable of shielding the signal lines.

A conventional coaxial transmission line will be described in the following.

A conventional coaxial transmission line, which is disclosed in Korean Patent Appln. No. 10-1999-0059866 and is titled "COAXIAL TYPE SIGNAL LINE AND MANUFACTURING METHOD THEREOF".

Figure 1:
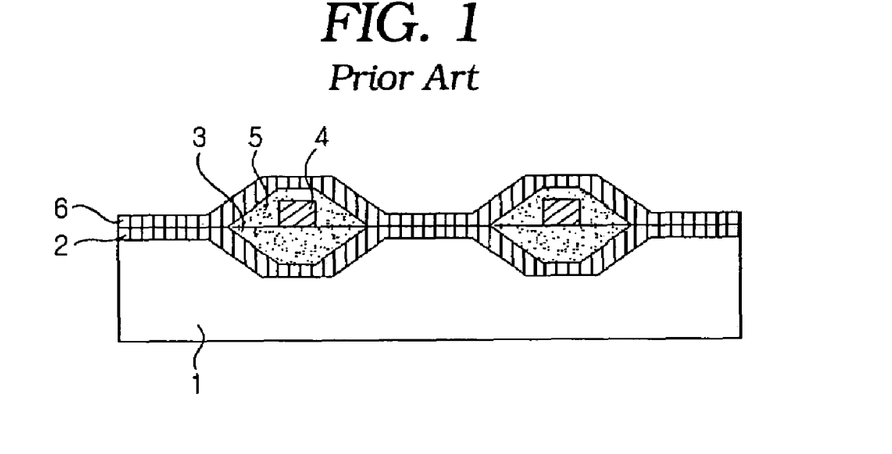
FIG. 1 is a sectional view of a conventional coaxial transmission line.

FIG. 1 is a sectional view to show the conventional coaxial transmission line. In order to provide dielectric layers between signal lines and ground layers during the manufacture of the coaxial transmission line, a liquid polymer material 3 is coated on a semiconductor substrate 1 through a spin coating method, and then the semiconductor substrate 1 coated with the liquid polymer material 3 is cured at 200° C. While the above-mentioned process is repeated, a flattening process is carried out, thus providing a multi-layer film. Metal lines for signal lines 4 are arranged on the film, and another polymer material 5 is coated on the metal lines, and then cured.

The method of manufacturing the coaxial transmission line will be described in detail in the following. First, grooves are formed on predetermined portions of the semiconductor substrate 1, and a first ground layer 2 is formed on the substrate 1. Subsequently, the liquid polymer material 3 is coated on the first ground layer 2, and then flattening and curing processes are executed. The signal lines 4 are arranged on the cured polymer material 3, and a second polymer material 5 is coated on the signal lines 4. Thereafter, the second polymer material 5 is cured and etched, thus providing a second ground layer 6.

However, such a method has problems in that it takes a longer time to manufacture the coaxial transmission line, and a stress is generated due to a difference in thermal expansive coefficient of interface between the polymer film and other material during the hot curing process, thus reducing yield. Meanwhile, in order to reduce a signal loss caused in a dielectric during a signal transmission, an air layer whose dielectric loss is little may be used in place of the dielectric. However, the method of using the air layer has a problem in that it is difficult to manufacture the coaxial transmission line, thus incurring great expense.

SUMMARY OF THE INVENTION

Accordingly, the present invention has been made keeping in mind the above problems occurring in the prior art, and an object of the present invention is to provide a coaxial transmission line, which prevents a radiative signal loss of signal lines during transmission of an RF signal, and removes signal interference between adjacent signal lines while allowing the signal lines to be compactly arrayed on an integrated circuit, thus reducing a dimension of RF electrical equipment using the transmission line system.

Another object of the present invention is to provide a fabrication method of the coaxial transmission line and a method of integrating multiple chips using the coaxial transmission line.

In order to accomplish the above object, the present invention provides a coaxial transmission line, including a main groove provided on a semiconductor substrate to form a coaxial cross-section, a first ground layer provided on both a surface of the groove and a flat surface of the substrate, an electrically conductive epoxy coated on a flat part of the first ground layer except the groove, thus serving as an adhesive material, a second ground layer provided at a position on the electrically conductive epoxy so that the electrically conductive epoxy is coated on contact surfaces of the first and second ground layers, a dielectric film provided at a position above both the groove and the second ground layer, a third ground layer provided on an upper surface of the dielectric film, and a signal line attached to a lower surface of the dielectric film to be placed in a space defined by the groove and the lower surface of the dielectric film.

Further, an anisotropic conductive film (ACF) may be used in place of the electrically conductive epoxy.

In order to accomplish the above object, the present invention provides a method of manufacturing a coaxial transmission line, including etching a groove on a semiconductor substrate to form a coaxial cross-section, forming a first ground layer on both a surface of the groove and a flat surface of the substrate, providing a dielectric film, forming a second ground layer on an upper surface of the dielectric film, forming a via hole to pass through both the second ground layer and the dielectric film, forming a third ground layer and a signal line on a lower surface of the dielectric film with both the via hole and the second ground layer so that the third ground layer is separated from the signal line, and adhering an upper surface of the first ground layer to a lower surface of the third ground layer, using an electrically conductive epoxy.

Further, the adhering of the first ground layer to the third ground layer includes providing an anisotropic conductive film at a position above the first ground layer so that the anisotropic conductive film is flatly placed, and placing a product from the forming of the third ground layer and the signal line on the anisotropic conductive film, and then applying a pressure so that the product is adhered to the anisotropic conductive film.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Hereinafter, embodiments of the present invention will be described in detail with reference to the attached drawings.

Reference now should be made to the drawings, in which the same reference numerals are used throughout the different drawings to designate the same or similar components.

FIGS. 2a through 2h are sectional views to a method of manufacturing a coaxial transmission line using a dielectric film, according to the present invention. The manufacturing method will be described in detail in the following.

Figure 2A:
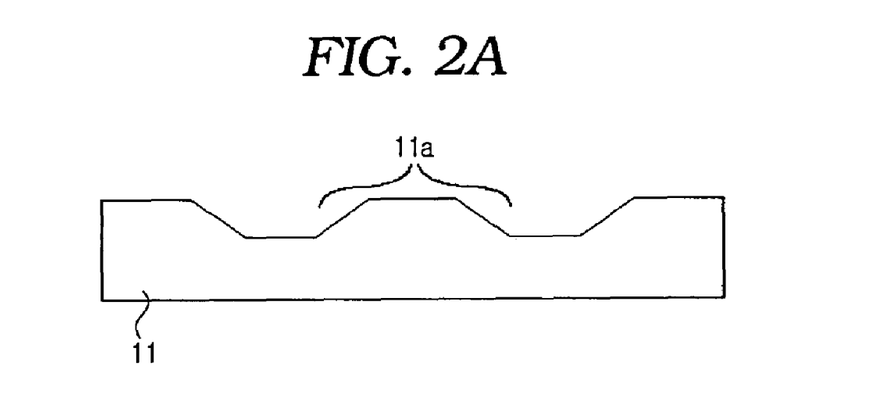
FIGS. 2a through 2h are sectional views to a method of manufacturing a coaxial transmission line using a dielectric film, according to the present invention.

First, as shown in FIG. 2a, main grooves 11a are formed on a semiconductor substrate 11 using a semiconductor etching device to form a coaxial cross-section. At this time, a protective film covers prefabricated devices to prevent the devices from being etched.

Figure 2B:
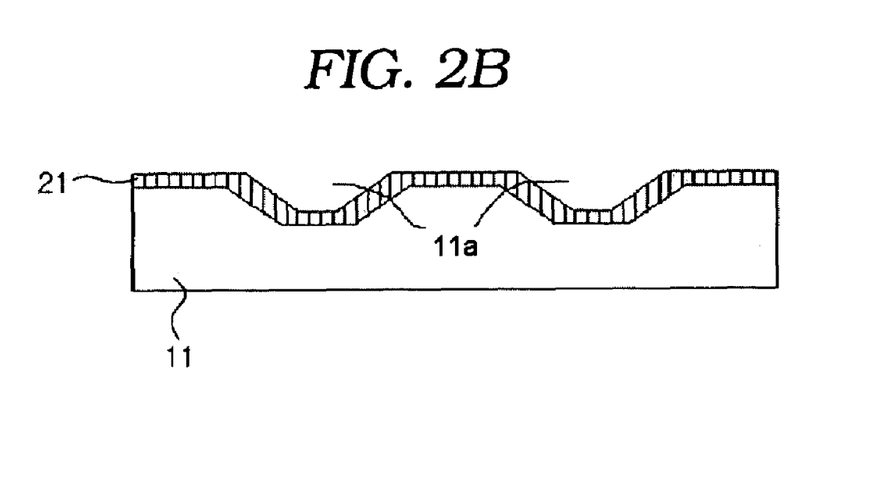

Next, as shown in FIG. 2b, in order to form an outer ground layer of the coaxial transmission line, the substrate 11 and the main grooves 11a are plated with a metal, thus providing a first ground layer 21.

Figure 2C:
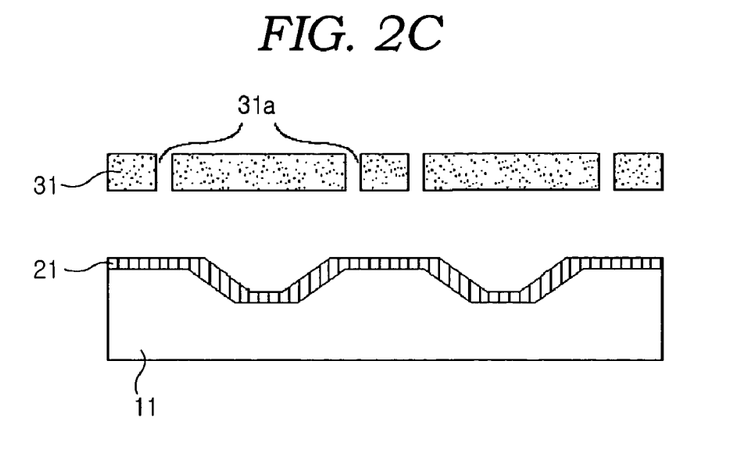

Thereafter, as shown in FIG. 2c, via holes 31a are provided at predetermined portions of a dielectric film 31 using the etching device. The dielectric film 31 supports signal lines 51b (see FIG. 2e), and fills spaces between the signal lines 51b and a second ground layer 41 (see FIG. 2d) which is provided on an upper surface of the dielectric film 31. The via holes 31a electrically connect the second ground layer 41 which is placed on the upper surface of the dielectric film 31, to third ground layers 51a (see FIG. 2e), which are placed on a lower surface of the dielectric film 31 and will be described in detail hereinafter. Further, the via holes 31a connect the signal lines 51b to the upper surface of the dielectric film 31, when interconnecting the signal lines 51b.

Figure 2D:
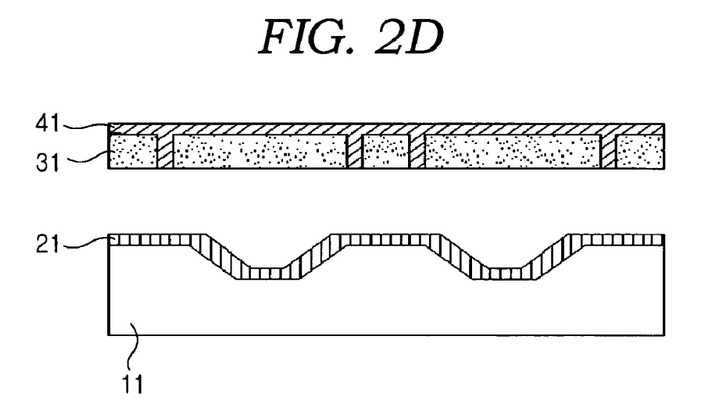

Subsequently, as shown in FIG. 2d, in order to provide the second ground layer 41 corresponding to the upper ground layer of the coaxial transmission line, a ground layer is provided on the upper surface of the dielectric film 31. Metal materials are filled in the via holes 31a (FIG. 2c) to electrically connect the upper and lower surfaces of the dielectric film 31.

Figure 2E:
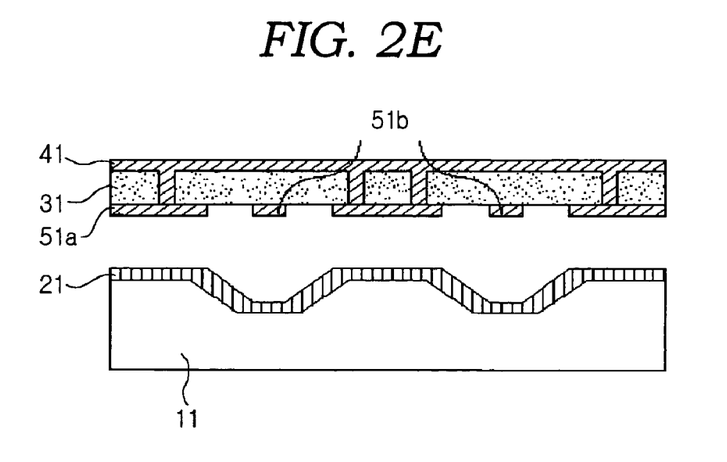

As shown in FIG. 2e, the signal lines 51b which are used to actually transmit signals are formed, and the third ground layers 51a are formed at opposite sides of each signal line 51b to electrically connect the second ground layer 41 to the first ground layer 21 which is provided at a predetermined position of the semiconductor substrate 11.

Figure 2F:
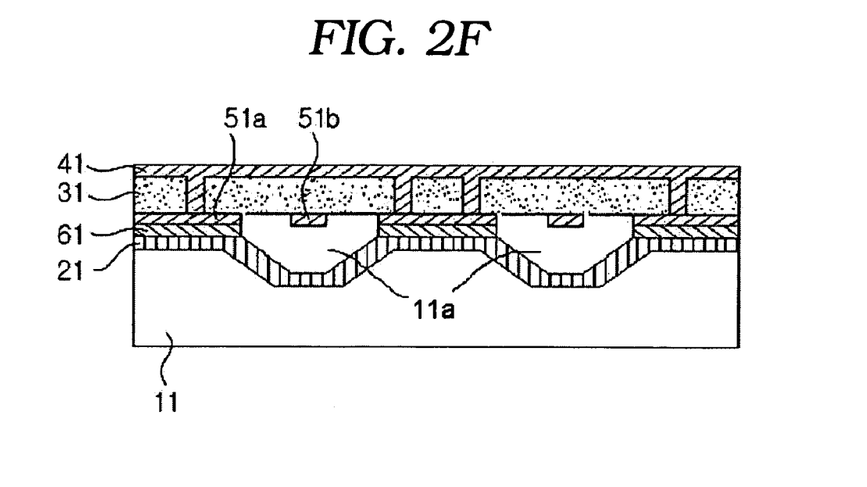

Subsequently, as shown in FIG. 2f, each of the signal lines 51b is arrayed to be aligned with a central axis of each of the main grooves 11a which are provided on the semiconductor substrate 11, and then the third ground layers 51a which are provided on the lower surface of the dielectric film 31 are adhered to the first ground layer 21 using an adhesive material 61. In this case, an electrically conductive epoxy may be used as the adhesive material 61. The adhesive material 61 is coated only on contact surfaces of the first and third ground layers 21 and 51a. After the adhesion process is completed, a curing process is carried out at about 100° C. In this case, FIG. 2f corresponds to a sectional view taken along the line a-a' of FIG. 3a.

As the adhesive material 61 may be used an anisotropic conductive film (ACF) or a nonconductive film which were disclosed by the same applicant in 2000 and 2001. The inventions disclosed by the same applicant are as follows. One of the inventions is titled 'METHOD FOR MANUFACTURING CONDUCTIVE ADHESIVE FOR HIGH FREQUENCY FLIP CHIP PACKAGE APPLICATIONS' (Korean Patent Appln. No. 1020010006475), and the other invention is titled 'ANISOTROPIC CONDUCTIVE FILM AND METHOD OF BONDING FLIP CHIP USING THE SAME' (Korean Patent Appln. No. 1020000044829).

Figure 2G:
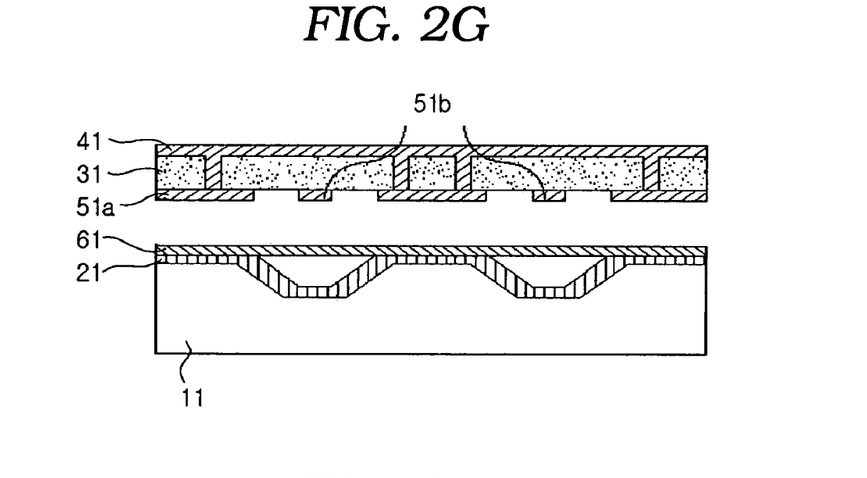

As an example, the case where the ACF is used as the adhesive material 61 will be described in the following. The ACF 61 is provided on the semiconductor substrate 11, and each of the signal lines 51b is arrayed to be aligned with the central axis of each of the main grooves 11a. Thereafter, heat and pressure are applied to the dielectric film 31 and the substrate 11. In this case, the pressure is applied to only flat parts, except the third ground layers 51a and the main grooves 11a of the substrate 11, so that the ACF 61 provided on the flat parts has electric conductivity. Meanwhile, the ACF 61 provided on parts to which the pressure is not applied, has a characteristic of a nonconductor, so that the signal lines 51b are insulated from the first, second, and third ground layers 21, 41, and 51a, thus providing the coaxial transmission line, as shown in FIG. 2g. In this case, the signal lines 51b may be arrayed relative to the main grooves 11a (FIG. 2f) using a conventional flip-chip bonding device.

Figure 2H:
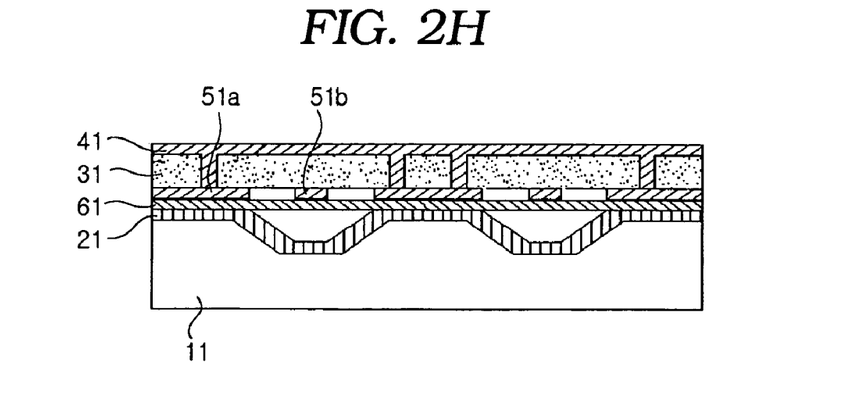

FIG. 2h is a sectional view of the coaxial transmission line which is completed by adhering the first and third ground layers 21 and 51a to each other using the ACF.

As shown in FIG. 2h, the ground layer of the coaxial transmission line comprises the first ground layer 21 which is provided on the upper surface of the substrate 11, the third ground layers 51a which are provided on the lower surface of the dielectric film 31 and are connected to the first ground layer 21 using the adhesive material 61, such as the electrically conductive epoxy or the adhesive film, and the second ground layer 41 which is provided on the upper surface of the dielectric film 31 and is connected to the third ground layers 51a through the metal materials filled in the via holes 31a. Filling materials to fill spaces between the signal lines 51b, and the first, second, and third ground layers 21, 41, and 51a, the adhesive material 61, and the via holes 31a (FIG. 2c) are air and the dielectric film 31. In this case, FIG. 2h corresponds to a sectional view taken along the line a-a' of FIG. 3a.

Figure 3A:
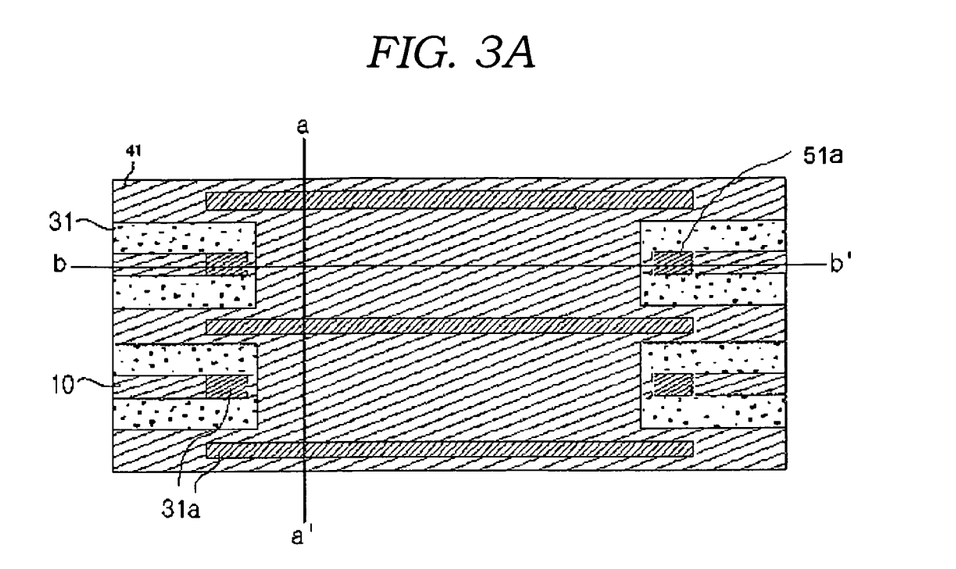
FIGS. 3a and 3b are respectively a plan view and a sectional view to show the coaxial transmission line, according to the present invention, in which the signal lines are connected to outer pads so as to measure performance of the transmission line system or connect the transmission line system to other devices.
Figure 3B:
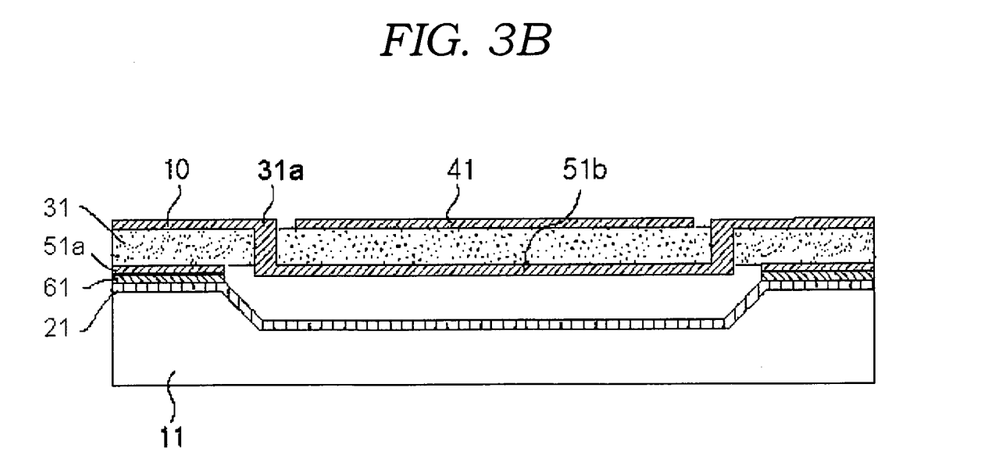

FIG. 3a is a plan view of the coaxial transmission line, according to the present invention, in which the signal lines are connected to outer pads so as to measure the transmission line system or connect the transmission line system to other devices. FIG. 3b is a sectional view taken along the line b-b' of FIG. 3a.

As shown in FIGS. 3a and 3b, each signal line 51b (FIG. 3b) is connected to a coplanar waveguide (CPW) 10 (FIGS. 3a and 3b) with the ground layer 41 having the ground layer 51a (FIG. 3b) on the lower surface of the dielectric film 31 or a microstrip line, which are provided on the upper surface of the dielectric film 31, through the via holes 31a. The first ground layer 21 is provided on the upper surface of the semiconductor substrate 11, the first ground layer 21 is connected with the third ground layers 51a which are provided on the lower surface of the dielectric film 31 using the adhesive material 61, as shown in FIG. 3b. The measurement of performance of the signal lines 51b and the connection of the signal lines 51b to an external system are carried out through the CPW 10 with the ground layer 41.

Figure 4:
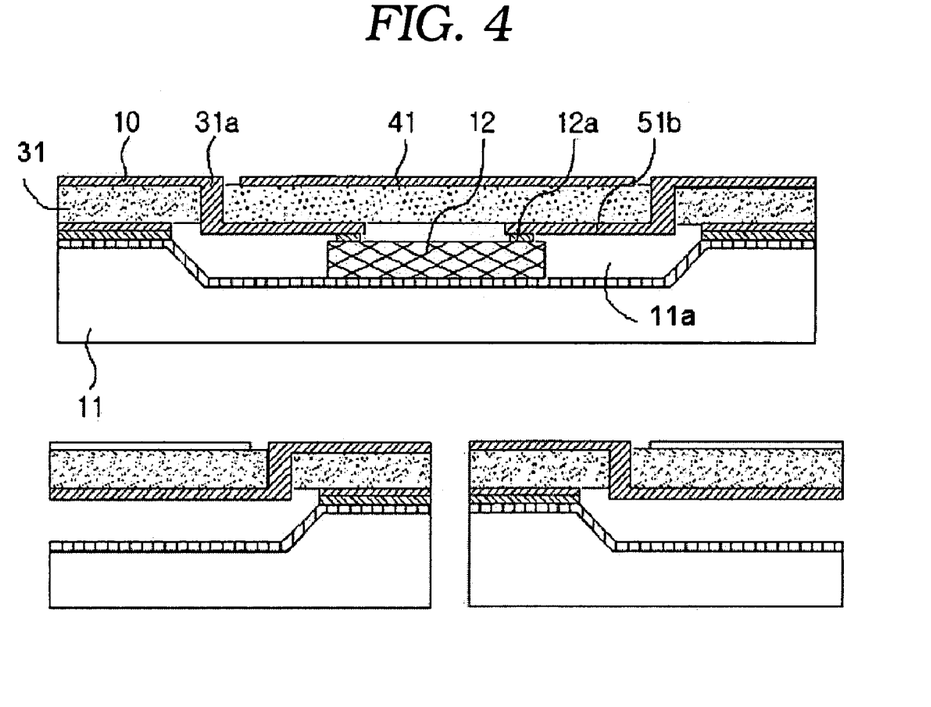
FIG. 4 is a sectional view to show a connection of a chip to the signal line for integrating multiple chips with a uniform thickness, using the coaxial transmission line according to the present invention.

FIG. 4 is a sectional view to show a connection of a chip for integrating multiple chips with a uniform thickness, using the coaxial transmission line according to the present invention.

As shown in FIG. 4, in order to integrate the chips 12, chip grooves are formed during a process of forming the main grooves 11a of the coaxial transmission line. A signal line 51b is connected to a coplanar waveguide 10 with the ground layer 41 provided on the upper surface of the dielectric film 31, through the via holes 31a. Each of the chips 12 is secured to the corresponding chip groove, using a heat conductive epoxy or a heat conductive material. Next, the dielectric film 31 is arrayed on the substrate 11, and then the dielectric film 31 is adhered to the substrate 11 using an adhesive film or adhesive epoxy. Simultaneously, each pad 12a of the chips 12 are connected to a pad formed by an end of the signal line 51b. Thus, when the multiple chip integration is executed, the chips 12 can be integrated at one time. In this case, the chips 12 must all have equal thickness.

Figure 5A:
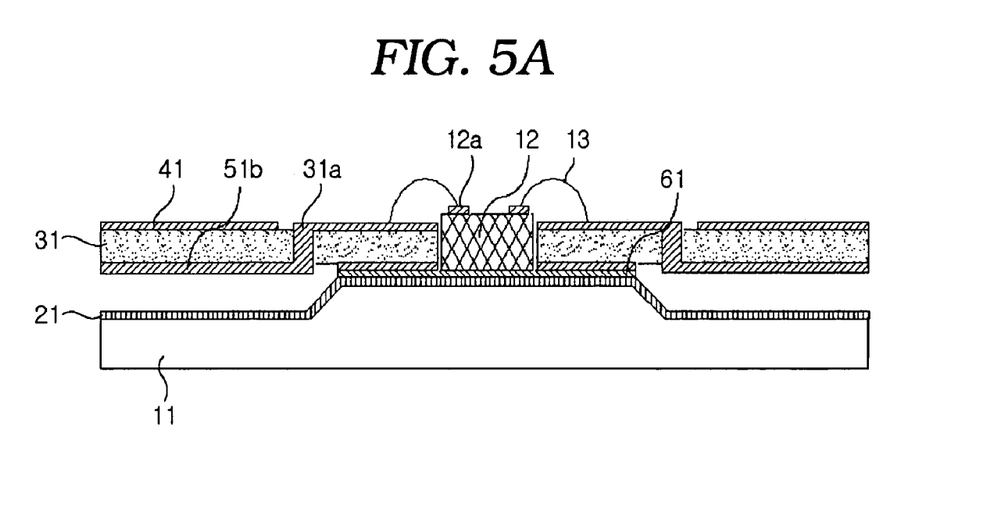
FIGS. 5a and 5b are sectional views to show a connection of a chip to the signal line for integrating multiple chips with non-uniform thicknesses, using the coaxial transmission line according to the present invention.
Figure 5B:
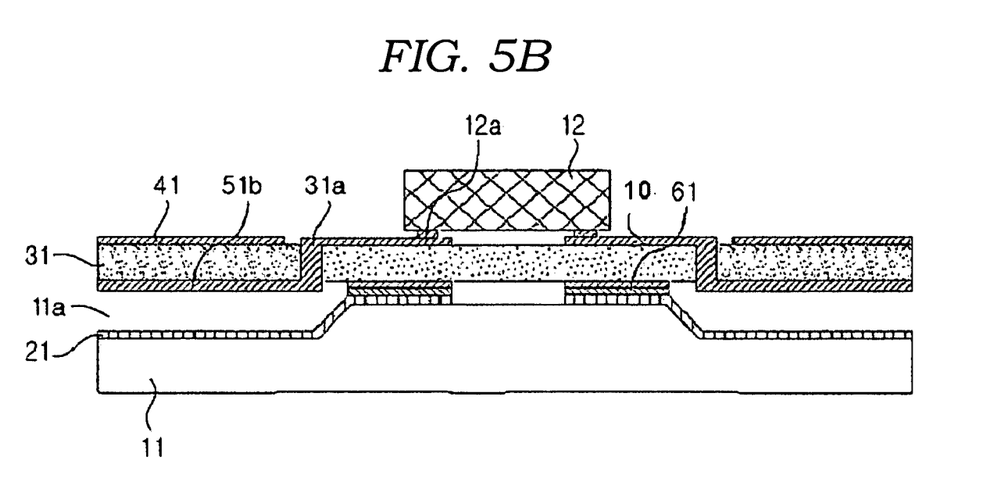

FIGS. 5a and 5b are sectional views to show a connection of a chip for integrating multiple chips with non-uniform thicknesses, using the coaxial transmission line according to the present invention.

As shown in FIG. 5a, when the via holes 31a are formed on the dielectric film 31, a chip hole is formed to have a large enough size to accommodate each chip 12 therein. The signal lines 51b is formed on the lower surface of the dielectric film 31. The ground layer 21 is formed on the substrate 11. The dielectric film 31 is adhered to the substrate 11 using the adhesive film 61, thus completing the fabrication of the transmission line system. Thereafter, the chips 12 are secured at predetermined positions, using the heat conductive epoxy. Subsequently, the pads 12a of each chip 12 are connected to the CPW 10 with the ground layer 41 or the microstrip line, through a conventional wire-bonding method using a bonding wire 13. FIG. 5b is a sectional view to show the chip 12 integrated by connecting the chip 12 to the CPW 10 with the ground layer 41 or the microstrip line, through a flip-chip bonding technique, after the fabrication of the transmission line system is completed. An integrated circuit IC is formed on the silicon substrate 11, and the U-shaped main grooves 11a are formed on the substrate 11. Subsequently, the ground layer 21 is formed on the substrate 11. The via holes 31a are formed on the dielectric film 31. Thereafter, the above-mentioned process is executed to provide the signal lines 51b on the lower surface of the dielectric film 31. Thereafter, the chip pads 12a are bonded to the signal lines 51b through the flip-chip bonding method, and the dielectric film 31 is arrayed on the substrate 11 having the IC. Next, the dielectric film 31 is adhered to the substrate 11 using the adhesive film 61. Thus, it is possible to provide an IC fabricated using the silicon chip 12 and the dielectric film 31.

As described above, the present invention provides a coaxial transmission line, which is capable of reducing a radiative signal loss of signal lines during transmission of an RF signal.

Further, the present invention provides a coaxial transmission line, which prevents signal interference between adjacent signal lines due to the radiation, thus achieving a compact array of the signal lines, and allowing a multi-chip package to be more easily obtained, therefore reducing a dimension of the IC.

Further, when the coaxial transmission line is applied to a circuit using a silicon substrate, active elements are deposited on the substrate, and then passive elements and signal lines are manufactured through a fabrication method of this invention, thus preventing a signal loss due to a dielectric loss of the substrate, and preventing signal interference, and preventing qualities of passive elements and signal lines from being deteriorated.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A coaxial transmission line, comprising:
a main groove provided on a substrate;
a first ground layer provided on a surface of the groove and a flat surface of the substrate;
an anisotropic conductive film placed at a position above the groove and on a part of the first ground layer located on the flat surface of the substrate;
a second ground layer provided on the anisotropic conductive film at a position corresponding to the part of the first ground layer located on the flat surface of the substrate;
a dielectric film provided at a position above the groove and on the second ground layer, the dielectric film having an upper surface and a lower surface;

a third ground layer provided on the upper surface of the dielectric film; and a signal line attached to the lower surface of the dielectric film to be placed in a space defined by the groove.

2. A method of integrating multiple chips with non-uniform thicknesses, using the coaxial transmission line of claim 1, comprising the steps of:

forming a chip hole, which has a sufficiently large size to accommodate each of the chips therein, during a process of forming the via hole on the dielectric film;

adhering the chip to a predetermined position of the substrate with a heat conductive epoxy, after the dielectric film is adhered to the substrate to form the signal line; and connecting a pad of the chip to a coplanar waveguide with a ground layer or to a microstrip line.

3. The method of integrating multiple chips with non-uniform thicknesses according to claim 2, wherein the pad is connected to the coplanar waveguide with the ground layer or to the microstrip line, through a wire-bonding method.

4. A method of packaging a coaxial transmission line of claim 1, comprising the step of connecting the signal line through a via hole to a coplanar waveguide with a ground layer having ground line on the lower surface of the dielectric film to a microstrip line, wherein the coplanar waveguide and the microstrip line are placed on the upper surface of the dielectric film.

5. The coaxial transmission line according to claim 1, further comprising:

a plurality of via holes passing through the second and third ground layers, wherein the via hole are filled with an electrically conductive material.

6. The coaxial transmission line according to claim 1, wherein the signal line is arrayed to be aligned with a central axis of the groove.

7. A method of integrating multiple chips with a uniform thickness, using the coaxial transmission line of claim 1, comprising the steps of:

securing each of the chips in a chip groove with a heat conductive material, the chip groove being formed during a process of forming the main groove;

adhering the dielectric film to the substrate with an adhesive film or an adhesive epoxy, after arraying the dielectric film on the substrate; and connecting a pad of the chip to a pad formed by an end of the signal line.

8. A method of manufacturing a coaxial transmission line, comprising the steps of:

(a) etching a groove on a substrate;

(b) forming a first ground layer on a surface of the groove and a flat surface of the substrate;

(c) providing a dielectric film having an upper surface and a lower surface;

(d) forming a second ground layer on the upper surface of the dielectric film;

(e) forming a via hole to pass through the second ground layer and the dielectric film;

(f) forming a third ground layer and a signal line on a lower surface of the dielectric film in a manner that the third ground layer is electrically separated from the signal line;

(g) providing an anisotropic conductive film at a position above the first ground layer in a manner that the anisotropic conductive film is flatly placed; and (h) placing the dielectric film having the third ground layer and the signal line on the anisotropic conductive film in a manner that the third ground layer is aligned with the first ground layer, and then applying a pressure so that the dielectric film is adhered to the anisotropic conductive film.

9. The method of manufacturing a coaxial transmission line according to claim 8, further comprising the step of filling an electrically conductive material in the via hole.

10. The method of manufacturing a coaxial transmission line according to claim 8, wherein the signal line is arrayed to be aligned with a central axis of the groove.

11. The method of manufacturing a coaxial transmission line according to claim 10, wherein the signal line is arrayed relative to the groove using a flip-flop bonding device.

* * * * *